(12) United States Patent
Devnath et al.

(10) Patent No.: US 7,301,366 B1
(45) Date of Patent: Nov. 27, 2007

(54) TUNING CONTROL FOR A PVT-COMPENSATING TUNABLE IMPEDANCE CIRCUIT

(75) Inventors: Varadarajan Devnath, Santa Clara, CA (US); Alan E. Segervall, Half Moon Bay, CA (US)

(73) Assignee: National Semiconductor Corporation, Santa Clara, CA (US)

(*) Notice: Subject to any disclaimer, the term of this patent is extended or adjusted under 35 U.S.C. 154(b) by 137 days.

(21) Appl. No.: 11/155,161

(22) Filed: Jun. 17, 2005

(51) Int. Cl.
   *H03K 19/003* (2006.01)
(52) U.S. Cl. .......................................... 326/30; 326/26
(58) Field of Classification Search ................. 326/30, 326/26–27, 31, 34
   See application file for complete search history.

(56) References Cited

U.S. PATENT DOCUMENTS

| | | | |
|---|---|---|---|
| 6,812,735 B1* | 11/2004 | Pham | 326/30 |
| 7,148,720 B2* | 12/2006 | Chen | 326/30 |
| 2006/0181335 A1* | 8/2006 | Hsu | 327/539 |

* cited by examiner

Primary Examiner—James H. Cho

(57) ABSTRACT

A tunable impedance circuit is provided wherein at least one of a plurality of impedance elements is combined with at least another of the plurality of impedance elements to produce a composite impedance. A control voltage is used to determine how many of the impedance elements are to be combined to produce the composite impedance. A current that is substantially invariant over a range of operating conditions is caused to flow through a control impedance to produce the control voltage.

20 Claims, 6 Drawing Sheets

US 7,301,366 B1

TUNING CONTROL FOR A PVT-COMPENSATING TUNABLE IMPEDANCE CIRCUIT

This application discloses subject matter related to subject matter disclosed in co-pending U.S. patent application Ser. No. 11/139,918 entitled "VOLTAGE MODE SERIAL INTERFACE DRIVER WITH PVT COMPENSATED IMPEDANCE" filed on May 27, 2005.

TECHNICAL FIELD OF THE INVENTION

The invention relates generally to serial data communication and, more particularly, to serial communication interface drivers.

BACKGROUND OF THE INVENTION

Conventional high speed serial communication interface drivers typically consume a relatively large amount of power due to the analog biasing requirements (current flows all the time). The relationship between the current consumed by the driver and the actual signal amplitude generated at the output of the driver can vary widely depending on the driver topology. Examples of conventional serial interface drivers are illustrated in FIGS. 1 and 2.

FIG. 1 illustrates a CML example including resistors R1, R2 and R3, transistors M1 and M2, and output driver 18. The transistors M1 and M2 are controlled by complementary digital inputs INP and INN. The circuit of FIG. 1 effectively has double 50 ohm termination, and the differential pair M1, M2 steers current to the output. Because of current division between the internal (R1 and R2) and external (R3) termination, only one-fourth of the output bias current I0 is used to generate the output voltage V0. A 10 mA output stage bias current is required to produce a 250 mV output swing. In FIG. 1, the currents I0, I1 and I2 illustrate the operation of the circuit with transistor M2 turned on, transistor M1 turned off and I0=10 mA.

FIG. 2 illustrates a prior art LVDS example including transistors M20-M23, resistors R3 and R4, and output driver 18. The circuit of FIG. 2 provides improved efficiency over the circuit of FIG. 1, because the "switch box" formed by transistors M20-M23 steers current to the output more effectively. Due to the double termination provided by R3 and R4, the effective impedance seen by the output driver 18 is 50 ohms differential. In the circuit of FIG. 2, a 500 mV output swing can be produced from a 10 mA bias current. The currents I0, I1 and I2 illustrate operation of the circuit of FIG. 2 with transistors M23 and M21 turned on, transistors M20 and M22 turned off, and I0=10 mA.

Comparing the power consumption of the prior art serial interface driver circuits of FIGS. 1 and 2, to produce a constant output voltage of 500 mV, and assuming a 2.5 V power supply, the circuit of FIG. 1 will have current and power requirements of 20 mA and 50 mW, and the circuit of FIG. 2 will have current and power requirements of 10 mA and 25 mW.

It is desirable in view of the foregoing to provide for serial communication interface drivers with current and power requirements that improve upon the performance of prior art serial communication interface drivers.

SUMMARY OF THE INVENTION

Exemplary embodiments of the invention provide a tunable impedance circuit wherein at least one of a plurality of impedance elements is combined with at least another of the plurality of impedance elements to produce a composite impedance. A control voltage is used to determine how many of the impedance elements are to be combined to produce the composite impedance. A current that is substantially invariant over a range of operating conditions is caused to flow through a control impedance to produce the control voltage.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 11, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged system.

Exemplary embodiments of the invention provide a voltage mode serial communication interface driver wherein the current steering switches also provide termination impedances. The output voltage is produced by a simple voltage divider between two regulated voltages (hence the foregoing phrase "voltage mode" driver), which results in more efficient operation than in the prior art serial interface driver circuits.

Figure 1:
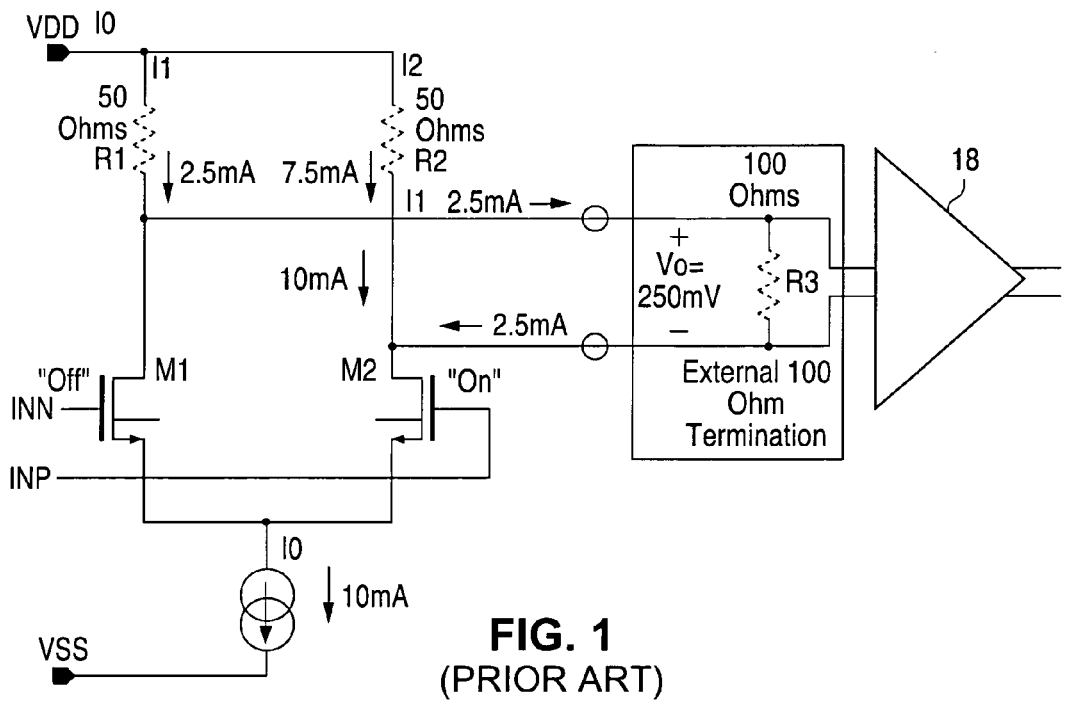
FIG. 1 diagrammatically illustrates a CML serial interface driver according to the prior art.
Figure 2:
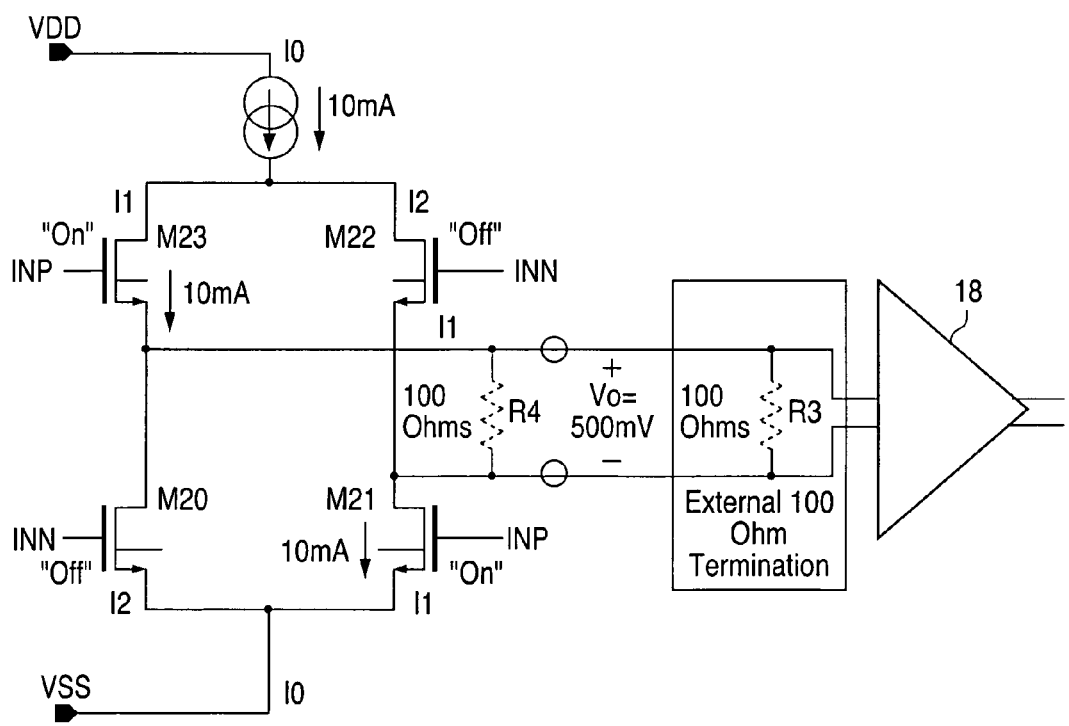
FIG. 2 diagrammatically illustrates an LVDS serial interface driver according to the prior art.
Figure 3:
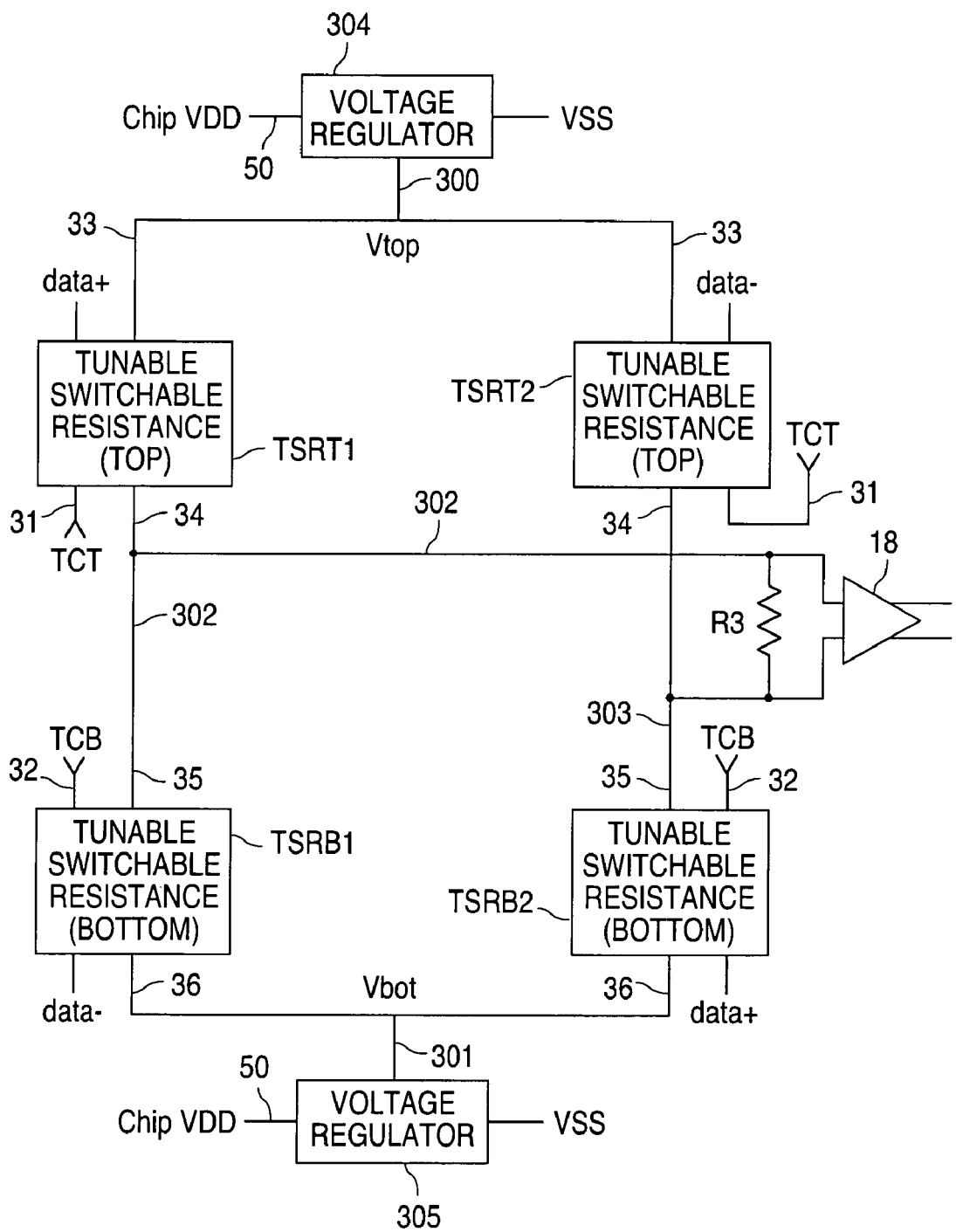
FIG. 3 diagrammatically illustrates exemplary embodiments of a serial interface driver according to the invention.

This is illustrated diagrammatically in FIG. 3, wherein tunable switchable resistances shown generally at TSRT1, TSRT2, TSRB1 and TSRB2 provide both "switch box" current-steering functionality and termination impedances. These impedances, together with termination impedance R3, form voltage dividers which produce the output voltage across R3. When the data+ signal is active, TSRT1 and TSRB2 are activated to establish a voltage-dividing current path between the voltage Vtop produced by voltage regulator 304 and the voltage Vbot produced by voltage regulator 305. The voltage-dividing current path extends from the voltage Vtop at 300 through top tunable switchable resistance TSRT1, termination resistor R3, and bottom tunable switchable resistance TSRB2. When the data+ signal is active, the complementary data-signal is inactive, so the top tunable switchable resistance TSRT2, and the bottom tunable switchable resistance TSRB1, are inactivated (and thus out of the circuit) while TSRT1 and TSRB2 are activated.

Conversely, when the data− signal is active and the data+ signal is inactive, the voltage-dividing current path extends from the output 300 of voltage regulator 304 through top tunable switchable resistance TSRT2, termination resistance R3, and bottom tunable switchable resistance TSRB1, to the output 301 of voltage regulator 305, with TSRT1 and TSRB2 inactivated and out of the circuit.

In some embodiments, the tunable switchable resistances TSRT1, TSRT2, TSRB1 and TSRB2 are designed to present a resistance value of 50 ohms, and Vtop=3.3 volts and Vbot=1.3 volts. In such embodiments, and assuming again the same exemplary termination resistance R3=100 ohms as in FIGS. 1 and 2 above, the output voltage across the termination resistor R3 is 1 volt at a current of 10 mA ((3.3−1.3)/(50+100+50)).

Considering again the 500 mV output example discussed above with respect to prior art FIGS. 1 and 2, and again assuming a 2.5 volt power supply, if the switchable resistance values are set to 50 ohms, the arrangement of FIG. 3 requires 5 mA and 12.5 mW to produce a constant output voltage of 500 mV.

In some embodiments, the voltage regulators 304 and 305 use conventional folded cascode voltage reference topology. In one exemplary embodiment, Vtop=1.475 V and Vbot=925 mV, which produces an output voltage of 275 mV +/− 125 mV and a common mode voltage of 1.2 V +/− 0.250 V.

Exemplary embodiments of the invention recognize that resistance values in semiconductor devices can vary due to variable parameters such as PVT (process, voltage, temperature) variations. Accordingly, in some embodiments, the switchable resistances are tunable in order to compensate for variations in resistances due to such variable parameters. As shown in FIG. 3, each of the top tunable switchable resistances TSRT1 and TSRT2 includes a tuning control input 31 driven by a tuning control signal TCT, and each of the bottom tunable switchable resistance TSRB1 and TSRB2 includes a tuning control input 32 driven by a tuning control signal TCB. The tuning control signals permit the resistance values presented by TSRT1, TSRT2, TSRB1 and TSRB2 to be suitably tuned (adjusted) to compensate for variations such as PVT variations.

Figure 4:
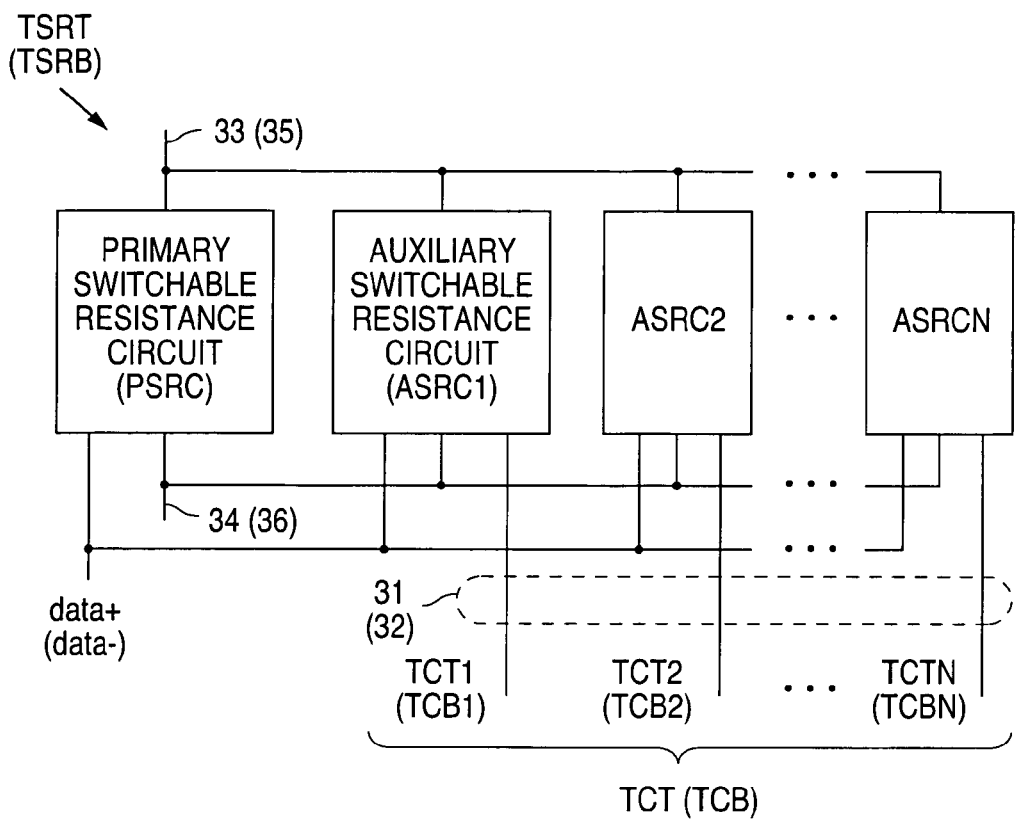
FIG. 4 diagrammatically illustrates exemplary embodiments of the tunable switchable resistances of FIG. 3.

FIG. 4 diagrammatically illustrates exemplary embodiments of the tunable switchable resistances TSRT1, TSRT2, TSRB1 and TSRB2 of FIG. 3. As shown in FIG. 4, each of the top tunable switchable resistances TSRT1 and TSRT2, and each of the bottom tunable switchable resistances TSRB1 and TSRB2, includes a primary switchable resistance circuit PSRC connected in parallel with a plurality of auxiliary switchable resistance circuits (ASRC1, ASRC2, . . . ASRCN). The data+/data− signals are input to PSRC and each of ASRC1-ASRCN. Also as shown in FIG. 4, the tuning control signals TCT and TCB are composite signals that each comprise a plurality of individual control signals TCT1-TCTn and TCB1-TCBn. The individual control signals TCT1-TCTn (TCB1-TCBn) are input to the respective auxiliary switchable resistance circuits ASRC1-ASRCN.

In some embodiments, N=15, and the nominal impedance valued provided by ASRC1-ASRCN are larger than the nominal impedance values provided by PSRC. In some embodiments, PSRC is designed to provide at least a desired resistance (e.g. 50 ohms) at the fast, cold (least resistance) corner, and ASRC1-ASRCN are designed so that PSRC together in parallel combination with all of ASRC1-ASRCN provides no more than the parallel resistance at the opposite extreme, namely the slow, hot (highest resistance) corner. Various other parallel combinations of PSRC with one or more but less than all of the ASRCs can be used to provide various other composite impedance values that cover the range of PVT conditions between the fast, cold corner and the slow, hot corner.

Figure 5:
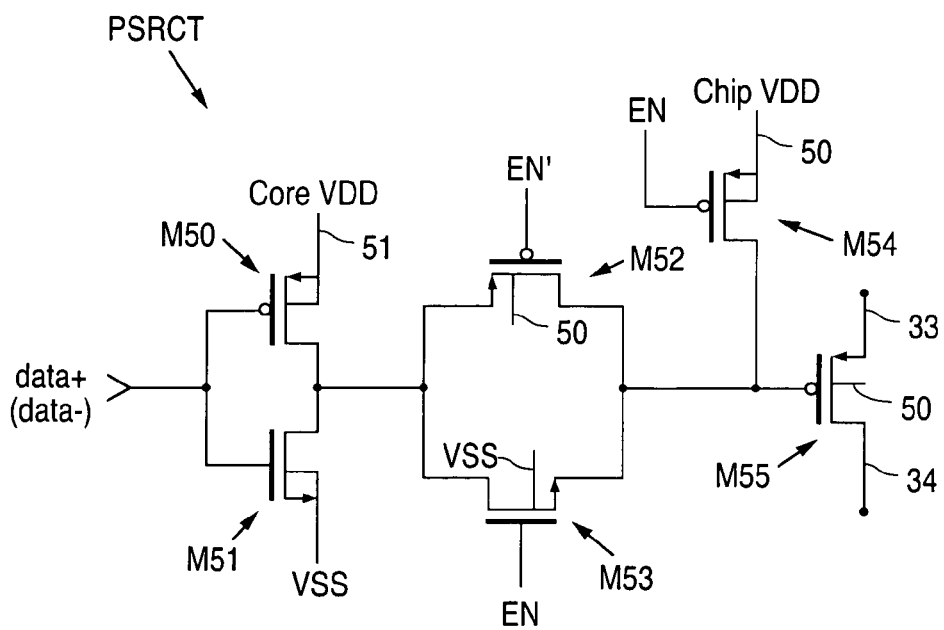
FIG. 5 diagrammatically illustrates exemplary embodiments of the primary switchable resistance circuit of FIG. 4.

FIG. 5 diagrammatically illustrates at PSRCT exemplary embodiments of the primary switchable resistance circuit PSRC of FIG. 4, designed for use in the top tunable switchable resistances TSRT1 and TSRT2 of FIG. 3. The primary switchable resistance circuit example of FIG. 5 includes an input inverter defined by transistors M50 and M51, a pass gate defined by transistors M52 and M53, and the actual switchable resistance as defined by transistor M55. The bulk contacts of the PMOS transistors M52, M54 and M55 are connected to the chip VDD 50 (for example 2.5 volts), and the bulk contact of PMOS transistor M50 is connected to the core VDD 51 (for example 1 volt). The NMOS transistors M51 and M53 have their bulk contacts connected to VSS. The enable signal EN (and its complement EN') permit the transistor M55 to be selectively isolated from the data+ (data−) input. When the signal EN is high, the pass gate at M52, M53 permits the gate of M55 to be driven by an inverted version of the data+ (data−) input signal. When the EN signal is low, the pass gate M52, M53 isolates transistor M55 from the inverter M50, M51, and the PMOS transistor M54 pulls the gate of transistor M55 up to chip VDD 50 to ensure that the transistor M55 is completely off (high impedance state) and thus removed from the circuit of FIG. 3. In some embodiments, the transistors M50-M55 are sized as follows:

| Transistor | Channel Width |
|---|---|
| M50 | 19.6 u |
| M51 | 8 u |
| M52 | 19.6 u |
| M53 | 8.4 u |
| M54 | 2.5 u |
| M55 | 85 u |

Figure 6:
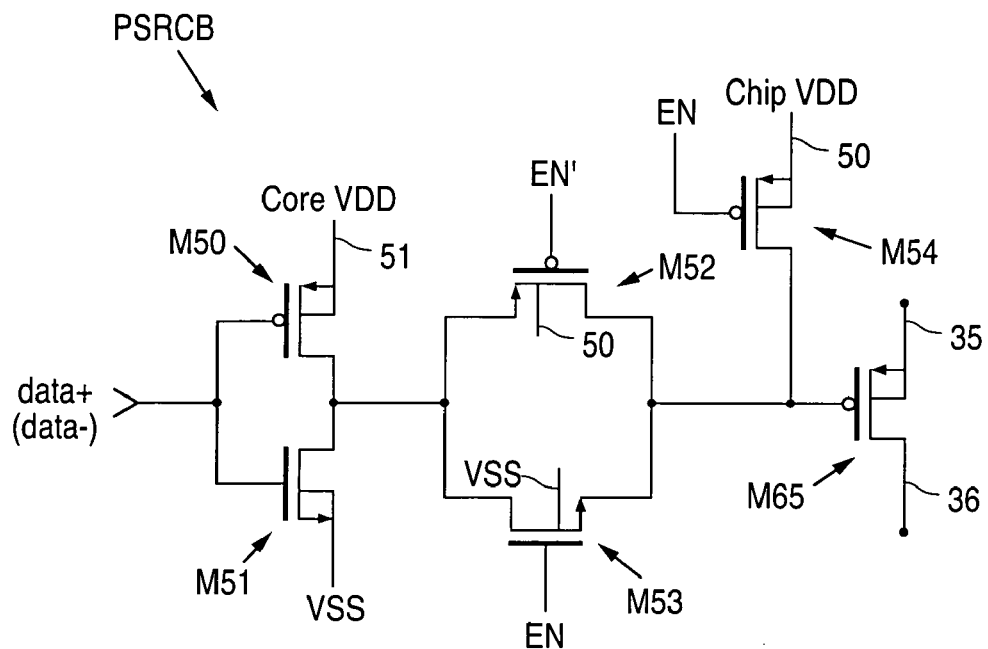
FIG. 6 diagrammatically illustrates further exemplary embodiments of the primary switchable resistance circuit of FIG. 4.

FIG. 6 diagrammatically illustrates at PSRCB exemplary embodiments of the primary switchable resistance circuit PSRC of FIG. 4, designed for use in the bottom tunable switchable resistances TSRB1 and TSRB2 of FIG. 3. The PSRCB of FIG. 6 is generally similar to the PSRCT of FIG. 5, except the PMOS transistor M55 of FIG. 5 is replaced in FIG. 6 with PMOS transistor M65 having a channel width of 110 u. Also, the bulk contact of transistor M65 is connected to the source thereof in order to reduce the body effect and improve the "on" resistance of transistor M65.

Figure 7:
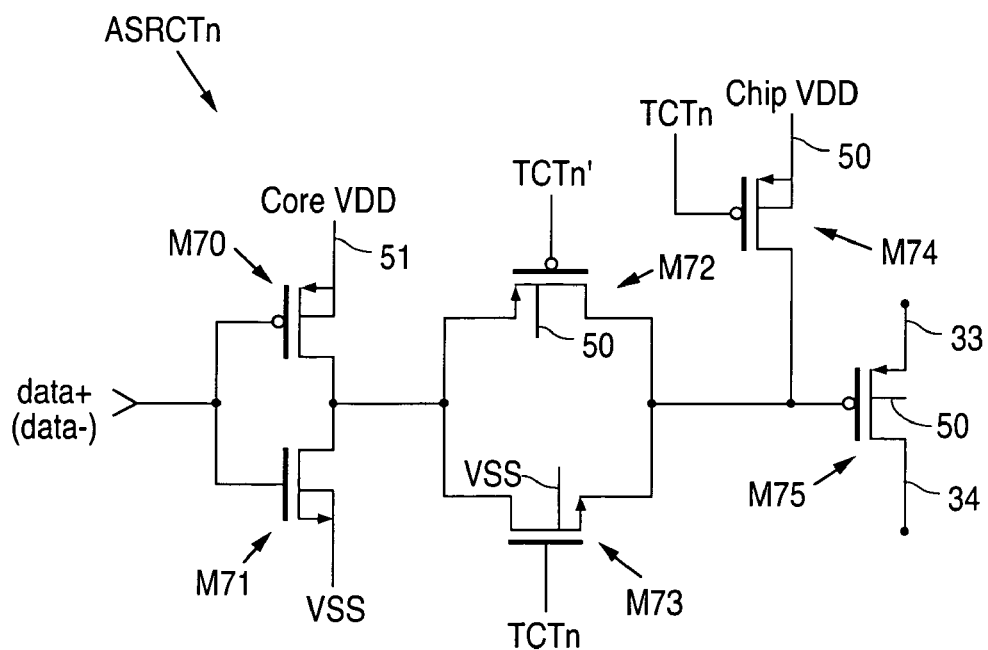
FIG. 7 diagrammatically illustrates exemplary embodiments of the auxiliary switchable resistance circuits of FIG. 4.

FIG. 7 diagrammatically illustrates at ASRCTn exemplary embodiments of the auxiliary switchable resistance circuits ASRC1-ASCRn, designed for use in the top tunable switchable resistances TSRT1 and TSRT2 of FIG. 3. As used herein, n can take the values of 1, 2, . . . N. The ASRCT illustrated in FIG. 7 is generally similar to the PSRCT illustrated in FIG. 5, except the enable signal EN (EN') of FIG. 5 is replaced by the corresponding portion of the tuning control signal TCT, namely TCTn and its complement TCTn'. Also, the transistors M70-M75 of the ASRCT of FIG. 7 are sized differently than the corresponding transistors M50-M55 of FIG. 5. In some embodiments, the transistors of FIG. 7 are sized as follows:

| Transistor | Channel Width |
|---|---|
| M70 | 3 u |
| M71 | 1.25 u |
| M72 | 3 u |
| M73 | 1.25 u |
| M74 | 1 u |
| M75 | 11.5 u |

Figure 8:
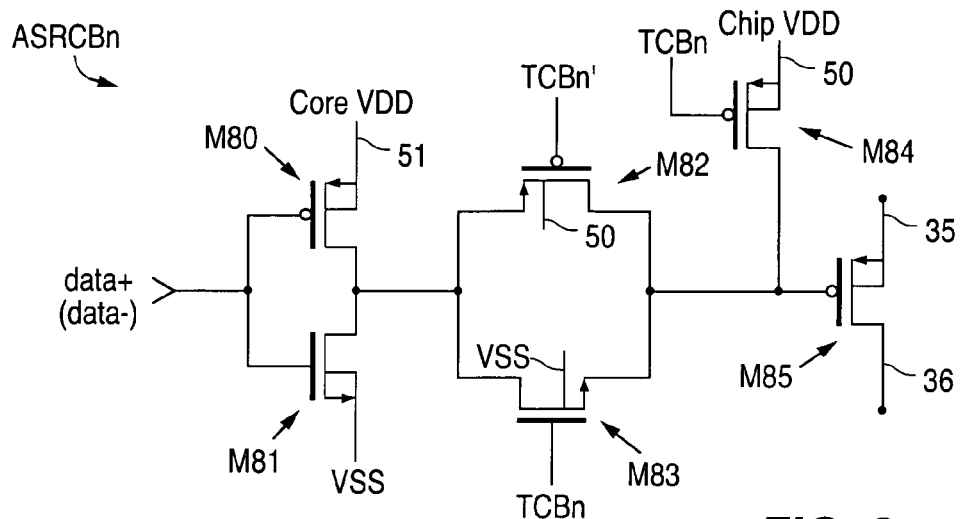
FIG. 8 diagrammatically illustrates further exemplary embodiments of the auxiliary switchable resistance circuits of FIG. 4.

FIG. 8 diagrammatically illustrates at ASRCBn exemplary embodiments of the auxiliary switchable resistance circuits ASRC1-ASRCn of FIG. 4, designed for use in the bottom tunable switchable resistances TSRB1 and TSRB2 of FIG. 3. The ASRCB of FIG. 8 is similar to the ASRCT of FIG. 7, except the tuning control signal TCTn (TCTn') of FIG. 7 is replaced by the corresponding portion of the tuning control signal TCB, namely TCBn and its complement TCBn'. The output transistor M85 has its bulk contact connected to its source, in generally similar fashion to the bulk connection of transistor M65 in the PSRCB of FIG. 6. Also, in some embodiments, the sizes of transistors M80-M85 in FIG. 8 differ from the sizes of transistors M70-M75 of FIG. 7. More specifically, in some embodiments, the transistors M80-M85 of FIG. 8 are sized as follows:

| Transistor | Channel Width |
|---|---|
| M80 | 2.35 u |
| M81 | 1.1 u |
| M82 | 2.35 u |
| M83 | 1.1 u |
| M84 | 1 u |
| M85 | 12 u |

Figure 9:
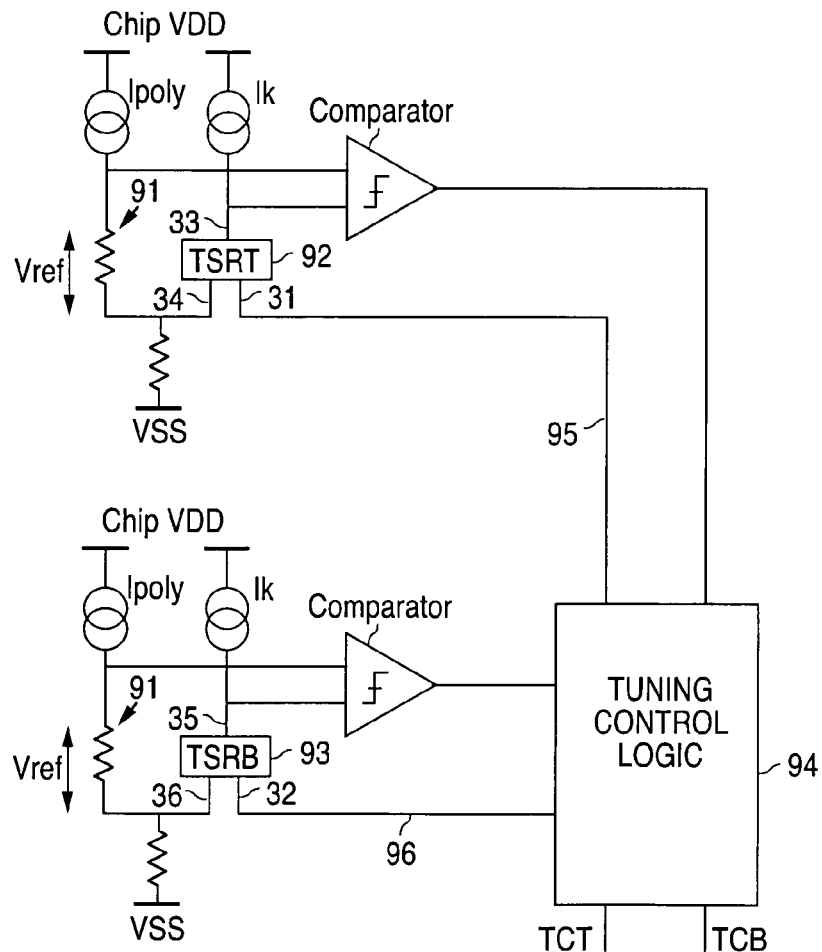
FIG. 9 diagrammatically illustrates exemplary embodiments of a tuning control circuit for controlling the tunable switchable resistances of FIG. 3.

FIG. 9 diagrammatically illustrates exemplary embodiments of a tuning control circuit for producing the tuning control signal TCT used to tune the top tunable switchable resistances TSRT1 and TSRT2 of FIG. 3, and the tuning control signal TCB used to tune the bottom tunable switchable resistances TSRB1 and TSRB2 of FIG. 3. As described above with respect to FIGS. 3 and 4, in order to tune TSRT1, TSRT2, TSRB1 and TSRB2 appropriately such that each one presents an impedance that is substantially invariant over all operating conditions, each one is constructed as a parallel-connected array including a primary switchable resistance circuit PSRC and a plurality of auxiliary switchable resistance circuits ASRC1-ASRCN. In some embodiments, ASRC1-ASRCN of a given TSRT or TSRB are designed to have equal impedances, and in other embodiments, ASRC1-ASRCN are designed so that their respective impedances represent binary weighted impedances. In any event, the impedances presented by the tunable switchable resistances can be changed by varying the number of ASRCs that are activated. The greater the number of ASRCs activated, the smaller the (nominal) impedance presented by the tunable switchable resistance, and vice versa.

In some embodiments, the primary switchable resistance circuit PSRC is designed such that its impedance is greater than the desired impedance at the PVT corner where the PMOS device impedance is lowest. The auxiliary switchable resistance circuits ASRC1-ASRCN are designed to have respective impedances such that they can be switched into parallel combination with the PSRC to achieve a desired impedance resolution. The total number of ASRCs is chosen such that the impedance when all ASRCs are connected in combination with the PSRC is less than the desired impedance at the PVT corner where the PMOS device impedance is highest. These exemplary design criteria ensure that each tunable switchable resistance can be calibrated to a desired impedance value at any set of PVT conditions.

The tuning control circuit of FIG. 9 utilizes two bandgap generated currents. One is a constant current Ik that is substantially invariant relative to PVT conditions, and the other is a current Ipoly which is inversely proportional to the poly sheet resistance of the semiconductor integrated circuit. The current Ipoly is passed through a poly resistor 91, and thus generates a reference voltage Vref that is substantially invariant relative to PVT conditions. The constant current Ik flows through a control impedance. In some embodiments, the control impedance is constructed as a replica of the tunable switchable resistance that will be tuned. For example, in FIG. 9, the current Ik flows through a control impedance 92 that is a replica of the top tunable switchable resistance TSRT, and the current Ik also flows through a control impedance 93 that is a replica of the bottom tunable switchable resistance TSRB. The current Ipoly, the poly resistor 91, and the constant current Ik can be designed such that, when the voltage drop across the control impedance at 92 or 93 is equal to the voltage drop across the poly resistor 91 (Vref), the control impedance 92 or 93 is presenting the desired impedance (for example 50 ohms).

Respective comparators compare the voltage drops across the control impedances 92 and 93 to the reference voltage Vref. Tuning control logic (e.g. DSP logic) 94 is responsive to the comparators for generating control signals 95 and 96. In embodiments that use TSRT and TSRB replica impedances at 92 and 93, the controls signals 95 and 96 would be TCT and TCB. The control signals 95 and 96 adjust the impedances presented by the control impedances 92 and 93 to the point where the voltage drops across the control impedances are equal to the reference voltage Vref. In embodiments that use replicas of TSRT and TSRB as the control impedances 92 and 93, the configurations of TCT and TCB that produce voltage drops of Vref across the respective replicas are also output by tuning control logic 94 to the TSRTs and TSRBs of FIG. 3. This ensures that the tunable switchable resistances of FIG. 3 will provide the desired resistance under the current PVT conditions.

Figure 10:
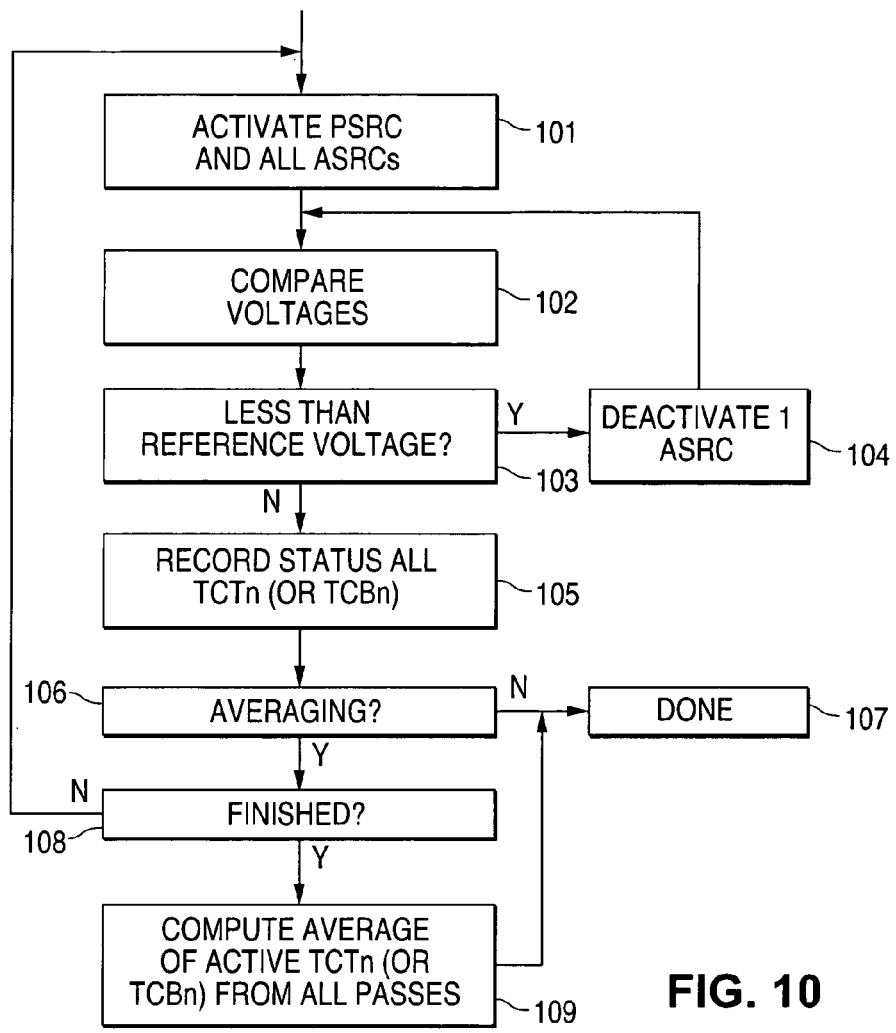
FIG. 10 illustrates exemplary operations which can be performed by the tuning control circuit of FIG. 9.

FIG. 10 illustrates exemplary operations which can be performed according to exemplary embodiments of the invention. As shown in FIG. 10, the PSRC and all of the ASRCs are initially activated at 101, so that the replica TSRT at 92 (or TSRB at 93) will present the lowest possible impedance. At 102, the voltage across the replica impedance is compared to the reference voltage. If the voltage across the replica impedance is less than the reference voltage at 103, then the impedance is too low, so one of the ASRCs is deactivated at 104, after which operations return to 102. When it is determined at 103 that the voltage drop across the replica impedance is greater than or equal to the reference voltage, the active/inactive status of all TCT (or TCB) bits currently controlling the replica impedance is recorded at 105. It is thereafter determined at 106 whether an averaging technique is to be utilized. If not, then operations are completed at 107.

If it is determined at 106 that averaging is to be utilized, then the operations at 101-105 can be repeated until it is determined at 108 that the averaging operation is finished. Thereafter, the average number of active TCT (or TCB) bits from all of the averaging passes is computed at 109. This average number of active bits can then be utilized to produce the TCT/TCB signals for tuning the corresponding tunable switchable resistances of FIG. 3.

Figure 11:
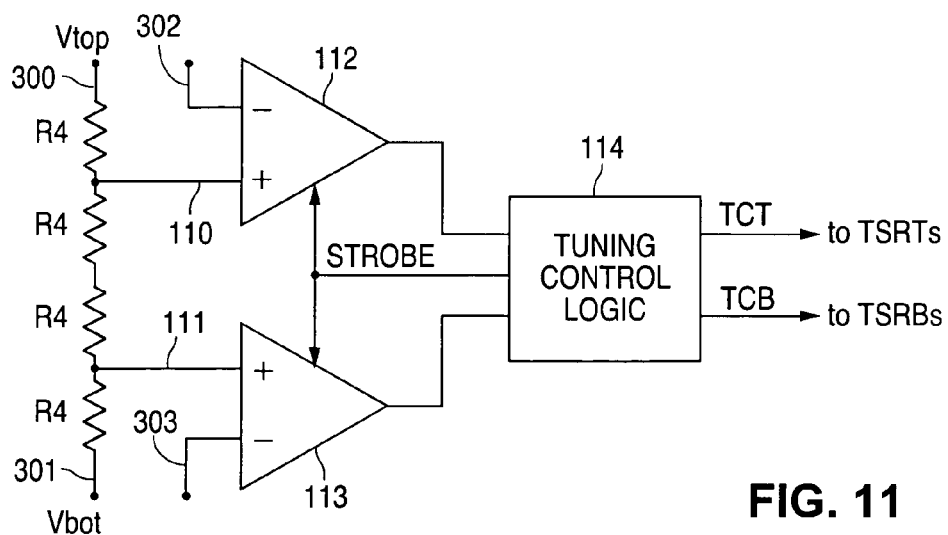
FIG. 11 diagrammatically illustrates exemplary embodiments of a tuning control circuit which tunes the tunable switchable resistances of FIG. 3 based on variations in the termination resistance.

FIG. 11 diagrammatically illustrates exemplary embodiments of a tuning control circuit for tuning the tunable switchable resistances of FIG. 3 based on variations in the termination resistance R3. The tuning control circuit of FIG. 11 exploits the fact that the serial communication interface driver of FIG. 3 utilizes a simple voltage divider circuit to generate the output voltage across termination resistance R3. Considering the aforementioned exemplary embodiments where R3=100 ohms and where the tunable switchable resistances are each designed to present 50 ohms, each of TSRT1, TSRT2, TSRB1 and TSRB2 will account for one-fourth of the total voltage drop between the voltage Vtop produced by the top voltage regulator 304 and the voltage Vbot produced by the bottom voltage regulator 305.

Accordingly, and as shown in FIG. 11, four resistors R4 having the same resistance value are connected in series with one another between the voltage Vtop and the voltage Vbot. In this arrangement, and with data+ or data− active in FIG. 3, the voltages at 110 and 111 should be the same as the respective voltages at 302 and 303 in FIG. 3. Accordingly, a comparator 112 is used to compare the voltage at 110 to the voltage at 302, and a comparator 113 is used to compare the voltage at 111 to the voltage at 303. Tuning control logic (e.g. DSP logic) 114 is responsive to the outputs of comparators 112 and 113 for suitably adjusting the tuning control signals TCT and TCB to bring the voltages 302 and 303 to the respectively desired levels defined at 110 and 111. As shown in FIG. 11, the tuning control logic 114 can, in some embodiments, utilize a control strobe to control the timing of the comparator operations.

The tuning control circuit of FIG. 11 permits the tunable switchable impedances TSRT1, TSRT2, TSRB1 and TSRB2 to be adapted to match the actual external termination impedance R3 which, for a nominal value of 100 ohms can easily vary from 80 ohms to 120 ohms. This matching provides improved performance with respect to reflections, signal integrity and jitter.

Referring again to the control signals TCT and TCB described with respect to FIGS. 3, 4, and 7-11, in some embodiments, the tuning control circuits of FIGS. 9-11 run continuously, periodically updating the tuning control signals TCT and TCB to adjust the impedance as operating conditions change. In order to avoid the possibility of increased jitter or bit errors due to the enabling of transistors during data transitions, some embodiments provide the tuning control signals TCB and TCT as thermometer-coded signals such that only one TCT/TCB bit (and thus only one of the transistors M75/M85) at a time can change state.

Although exemplary embodiments of the invention are disclosed with PMOS transistors providing switchable impedances, it will be evident to workers in the art that the switchable impedances can also be implemented with NMOS transistors or combinations of NMOS and PMOS transistors.

Although the present invention has been described with exemplary embodiments, various changes and modifications may be suggested to one skilled in the art. It is intended that the present invention encompass such changes and modifications as fall within the scope of the appended claims.

What is claimed is:

1. A tunable impedance circuit, comprising:
a primary switchable resistance circuit;
a plurality of auxiliary switchable resistance circuits connected in parallel with the primary switchable resistance circuit;
a tuning circuit coupled to said plurality of auxiliary switchable resistance circuits for combining at least one of said auxiliary switchable resistance circuits with at least another of said auxiliary switchable resistance circuits to produce a composite impedance;
said tuning circuit including a current source for producing a current that is substantially invariant over a range of operating conditions;
said tuning circuit including a control impedance coupled in series with said current source, said substantially invariant current flowing through said control impedance to produce a control voltage across said control impedance; and
said tuning circuit including a logic circuit coupled to said control impedance for determining, based on said control voltage, how many of said plurality of auxiliary switchable resistance circuits are to be combined to produce said composite impedance.

2. The circuit of claim 1, wherein said control impedance includes a further plurality of auxiliary switchable resistance circuits produced as a replicated version of said first-mentioned plurality of auxiliary switchable resistance circuits.

3. The circuit of claim 1, wherein said tuning circuit includes a compare circuit coupled to said control impedance for comparing said control voltage to a predetermined reference voltage.

4. The circuit of claim 3, wherein said compare circuit has an output coupled to said logic circuit.

5. The circuit of claim 3, wherein said tuning circuit includes a further current source for producing a further current, and a further impedance coupled in series with said further current source, said further current flowing through said further impedance to generate said predetermined reference voltage.

6. The circuit of claim 5, wherein said control impedance includes a further plurality of auxiliary switchable resistance circuits produced as a replicated version of said first-mentioned plurality of auxiliary switchable resistance circuits.

7. The circuit of claim 1, wherein each of said plurality of auxiliary switchable resistance circuits includes a control input, each said control input permitting the corresponding auxiliary switchable resistance circuit to be combined with said at least one auxiliary switchable resistance circuit to form said composite impedance, and said tuning circuit having a plurality of tuning control outputs respectively coupled to said control inputs.

8. The circuit of claim 7, wherein said control impedance includes a further plurality of auxiliary switchable resistance circuits produced as a replicated version of said first-mentioned plurality of auxiliary switchable resistance circuits wherein each of a remainder of said auxiliary switchable resistance circuits of said replicated version other than one said auxiliary switchable resistance circuit of said replicated version is coupled to said one auxiliary switchable resistance circuit of said replicated version and includes a control input for permitting said auxiliary switchable resistance circuit to be combined with said one auxiliary switchable resistance circuit of said replicated version to form a further composite impedance.

9. The circuit of claim 1, wherein said range of operating conditions includes a range of PVT conditions.

10. The circuit of claim 1, wherein each of said impedance elements includes a transistor.

11. A tunable impedance circuit comprising:
a plurality of impedance elements;
a tuning circuit coupled to said impedance elements for combining at least one of said impedance elements with at least another of said impedance elements to produce a composite impedance;
said tuning circuit including a current source for producing a current that is substantially invariant over a range of operating conditions;
said tuning circuit including a control impedance coupled in series with said current source, said substantially invariant current flowing through said control impedance to produce a control voltage across said control impedance; and
said tuning circuit including a logic circuit coupled to said control impedance for determining, based on said control voltage, how many of said impedance elements are to be combined to produce said composite impedance;
wherein said tuning circuit includes a compare circuit coupled to said control impedance for comparing said control voltage to a predetermined reference voltage;
wherein said tuning circuit includes a further current source for producing a further current, and a further impedance coupled in series with said further current source, said further current flowing through said further impedance to generate said predetermined reference voltage; and
wherein said further impedance includes a resistance that varies substantially inversely relative to said further current over said range of operating conditions.

12. The circuit of claim 11, wherein said resistance includes a polysilicon resistor.

13. A tunable impedance circuit, comprising:
a plurality of impedance elements;
a tuning circuit coupled to said impedance elements for combining at least one of said impedance elements with at least another of said impedance elements to produce a composite impedance;
said tuning circuit including a current source for producing a current that is substantially invariant over a range of operating conditions;
said tuning circuit including a control impedance coupled in series with said current source, said substantially invariant current flowing through said control impedance to produce a control voltage across said control impedance; and
said tuning circuit including a logic circuit coupled to said control impedance for determining, based on said control voltage, how many of said impedance elements are to be combined to produce said composite impedance;
wherein said tuning circuit includes a compare circuit coupled to said control impedance for comparing said control voltage to a predetermined reference voltage;
wherein said tuning circuit includes a further current source for producing a further current, and a further impedance coupled in series with said further current source, said further current flowing through said further impedance to generate said predetermined reference voltage; and
wherein said further impedance includes a resistor coupled between said further current source and said control impedance.

14. A tunable impedance circuit, comprising:
a plurality of impedance elements;
a tuning circuit coupled to said impedance elements for combining at least one of said impedance elements with at least another of said impedance elements to produce a composite impedance;
said tuning circuit including a current source for producing a current that is substantially invariant over a range of operating conditions;
said tuning circuit including a control impedance coupled in series with said current source, said substantially invariant current flowing through said control impedance to produce a control voltage across said control impedance; and
said tuning circuit including a logic circuit coupled to said control impedance for determining, based on said control voltage, how many of said impedance elements are to be combined to produce said composite impedance;
wherein each of a remainder of said impedance elements other than said at least one impedance element is coupled to said at least one impedance element and includes a control input, each said control input permitting the corresponding impedance element to be combined with said at least one impedance element to form said composite impedance, and said tuning circuit having a plurality of tuning control outputs respectively coupled to said control inputs; and
wherein said tuning control outputs of said tuning circuit provide a thermometer-coded tuning control signal.

15. A method of tuning a tunable impedance circuit that includes a primary switchable resistance circuit and a plurality of auxiliary switchable resistance circuits connected in parallel with the primary switchable resistance circuit, comprising:

operating the primary switchable resistance circuit;

disabling an operation of at least one of the auxiliary switchable resistance circuits to produce a composite impedance;

using a current that is substantially invariant over a range of operating conditions to generate a control voltage across a control impedance circuit; and based on the control voltage, determining how many of the auxiliary switchable resistance circuits are to be disabled to produce the composite impedance.

16. The method of claim 15, wherein said determining step includes comparing the control voltage to a predetermined reference voltage.

17. The method of claim 16, including using a further current to generate the reference voltage across a further impedance, wherein the further current and the further impedance vary substantially inversely relative to one another over the range of operating conditions.

18. A method of tuning a tunable impedance circuit that includes a plurality of impedance elements, comprising:

combining at least one of the impedance elements with at least another of the impedance elements to produce a composite impedance;

using a current that is substantially invariant over a range of operating conditions to generate a control voltage across a control impedance circuit; and based on the control voltage, determining how many of the impedance elements are to be combined to produce the composite impedance; and wherein said combining step includes combining the at least one impedance element with the at least another impedance element in response to a thermometer-coded signal.

19. The method of claim 18, including producing the thermometer-coded signal in response to said determining step.

20. A method of tuning a tunable impedance circuit that includes a plurality of impedance elements, comprising:

combining at least one of the impedance elements with at least another of the impedance elements to produce a composite impedance;

using a current that is substantially invariant over a range of operating conditions to generate a control voltage across a control impedance circuit; and based on the control voltage, determining how many of the impedance elements are to be combined to produce the composite impedance; and including performing said determining step at a plurality of points in time and using the results of said determining steps to compute an average number of impedance elements, said combining step including combining a number of impedance elements at least as great as the computed average number of impedance elements.

* * * * *